(12) United States Patent
Ichikawa et al.

(10) Patent No.: US 11,166,382 B2
(45) Date of Patent: Nov. 2, 2021

(54) CONNECTION STRUCTURE INCLUDING CIRCUIT BODY AND CONDUCTIVE BODY

(71) Applicant: YAZAKI CORPORATION, Tokyo (JP)

(72) Inventors: Yoshiaki Ichikawa, Makinohara (JP); Tatsuya Oga, Makinohara (JP); Mariko Nakagawa, Makinohara (JP); Tomoji Yasuda, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/090,447

(22) Filed: Nov. 5, 2020

(65) Prior Publication Data
US 2021/0136925 A1 May 6, 2021

(30) Foreign Application Priority Data
Nov. 5, 2019 (JP) .............................. JP2019-200732

(51) Int. Cl.
*H05K 1/00* (2006.01)
*H05K 3/36* (2006.01)
*H01L 23/532* (2006.01)
*H05K 1/18* (2006.01)
*H05K 3/30* (2006.01)
*H05K 3/32* (2006.01)

(52) U.S. Cl.
CPC ....... *H05K 3/361* (2013.01); *H01L 23/53295* (2013.01); *H05K 1/189* (2013.01); *H05K 3/303* (2013.01); *H05K 3/321* (2013.01); *H05K 2201/10007* (2013.01)

(58) Field of Classification Search
CPC ... H05K 3/361; H05K 1/189; H01L 23/53295
USPC ........................................................ 361/749
See application file for complete search history.

(56) References Cited

U.S. PATENT DOCUMENTS

2014/0011390 A1* 1/2014 Hasegawa .............. H01R 12/62
439/371
2015/0222032 A1* 8/2015 Goo .................... G02F 1/13452
361/748

FOREIGN PATENT DOCUMENTS

JP 2002-93995 A 3/2002
JP 2003-45508 A 2/2003

* cited by examiner

*Primary Examiner* — Andargie M Aychillhum
(74) *Attorney, Agent, or Firm* — Kenealy Vaidya LLP

(57) ABSTRACT

A connection structure includes: a circuit body including a flexible printed circuit having a wiring pattern; and a conductive body including a connection portion. The connection portion has a flat-plate shape and is connected to a mounting surface of the circuit body. The wiring pattern has a number of connection target portions each extending in a preset direction to cross the connection portion and is longer than a width of the connection portion in the preset direction. The connection portion and the connection target portions are electrically connected using a conductive adhesive to connect the wiring pattern and the conductive body.

4 Claims, 7 Drawing Sheets

CONNECTION STRUCTURE INCLUDING CIRCUIT BODY AND CONDUCTIVE BODY

CROSS-REFERENCE TO RELATED APPLICATIONS

This application is based on and claims priority under 35 USC 119 from Japanese Patent Application No. 2019-200732 filed on Nov. 5, 2019, the contents of which are incorporated herein by reference.

TECHNICAL FIELD

The present invention relates to a connection structure. The connection structure includes a circuit body including a flexible printed circuit (FPC) and a conductive body having a flat-plate-shaped connection portion.

BACKGROUND ART

In recent, FPCs which are formed with a wiring pattern are used as, for example, wiring means for connecting various electronic devices. FPCs have, in general, a structure that thin-film conductive layers constituting a wiring pattern (i.e., circuit) having a prescribed shape is sandwiched between insulative films and, in particular, has a feature that they can be deformed (e.g., warped) flexibly while their electrical characteristics are maintained.

A FPC is known that is, when used actually, the wiring pattern formed therein is connected to an electronic device such as an IGBT using bonding wires.

As for details of the above FPC, refer to JP 2002-093995 A.

Unlike in the above FPC, there is a case that a flat-plate-shaped conductive body such as a busbar is connected to the wiring pattern of an FPC using a conductive adhesive. In general, this kind of adhesive is formed by dispersing conductive fillers (e.g., metal particles) in a thermosetting resin that serves as abase material. When a busbar is pressed against the wiring pattern in a state that adhesive that is not set yet, some of the fillers are sandwiched between the wiring pattern and the busbar, part of the base material and remaining fillers are pushed out from between the wiring pattern and the busbar. This portion is heated from outside, whereby the base material is set in a state that the wiring pattern and the busbar are electrically connected to each other by the fillers. In this manner, the wiring pattern and the busbar are joined to each other.

Because of the principle of the above-described joining, in the case where a conductive adhesive is used, the size of a region where fillers are sandwiched between a wiring pattern and a busbar (i.e., the contact area of the wiring pattern and the busbar) influences the conductivity that is established between them (i.e., the magnitude of contact resistance). Thus, from the viewpoint of, for example, increasing the quality of a signal to be transmitted using the FPC, it is desirable that the wiring pattern and the busbar be connected to each other properly so that their contact area is as close to a design value as possible.

SUMMARY OF INVENTION

Aspect of a non-limiting embodiment of the present disclosure relates to provide a connection structure capable of properly connecting a circuit body including a flexible printed circuit and a conductive body having a flat-plate-shaped connection portion. Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided a connection structure comprising:
a circuit body including a flexible printed circuit having a wiring pattern and
a conductive body including a connection portion, the connection portion having a flat-plate shape and being connected to a mounting surface of the circuit body,
the wiring pattern having a plurality of connection target portions each extending in a preset direction to cross the connection portion and being longer than a width of the connection portion in the preset direction,
the connection portion and the connection target portions being electrically connected using a conductive adhesive to connect the wiring pattern and the conductive body.

BRIEF DESCRIPTION OF DRAWINGS

Exemplary embodiment(s) of the present invention will be described in detail based on the following figures, wherein.

DESCRIPTION OF EMBODIMENT

Figure 1:
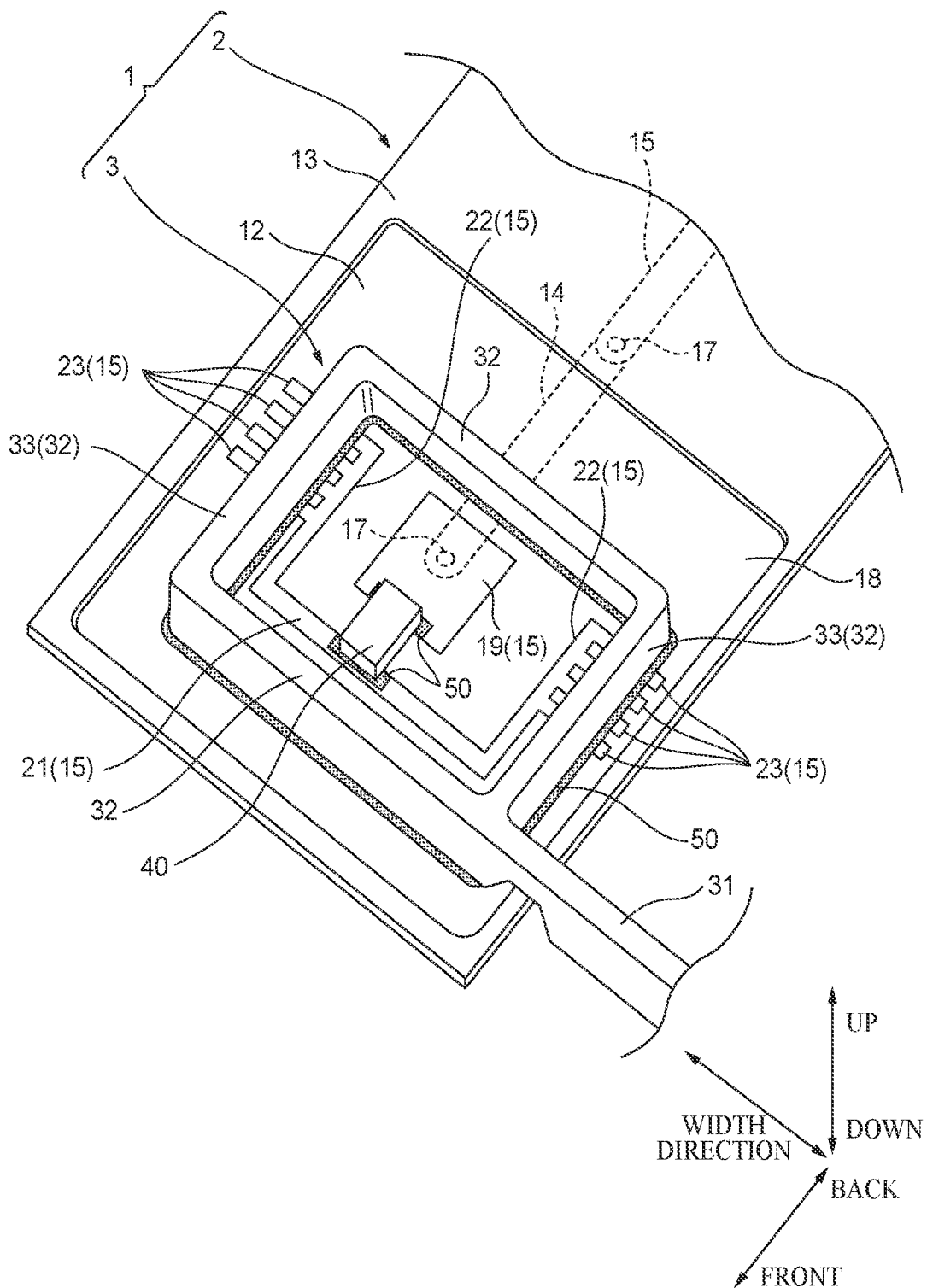
FIG. 1 is a perspective view of a connection structure of a circuit body and a conductive body according to an exemplary embodiment of the present invention.

A connection structure 1 of a circuit body 2 and a conductive body 3 according to an embodiment of the present invention will be hereinafter described with reference to the drawings. For the sake of convenience of description, the front-rear direction, the width direction, the top-bottom direction, the front side, the rear side, the top side, and the bottom side are defined as shown in FIG. 1 etc. The front-rear direction, the width direction, and the top-bottom direction are perpendicular to each other. The front-rear direction and the width direction coincide with the extension direction and the width direction of the circuit body 2 that extends like a band, respectively.

The connection structure 1 is provided with the circuit body 2 which is a flexible printed circuit (FPC) having a wiring pattern and the conductive body 3 having flat-plate-shaped connection portions 33 and attached to an opening portion 18 of an insulating layer 13 of the circuit body 2. For example, the connection structure 1 is used on a path that connects a battery assembly (a battery module in which plural cells are stacked) to serve as a drive battery installed in an electric vehicle, a hybrid vehicle, or the like and any of various control devices (ECU etc.). The structures of individual components of the connection structure 1 will be described one by one.

Figure 4:
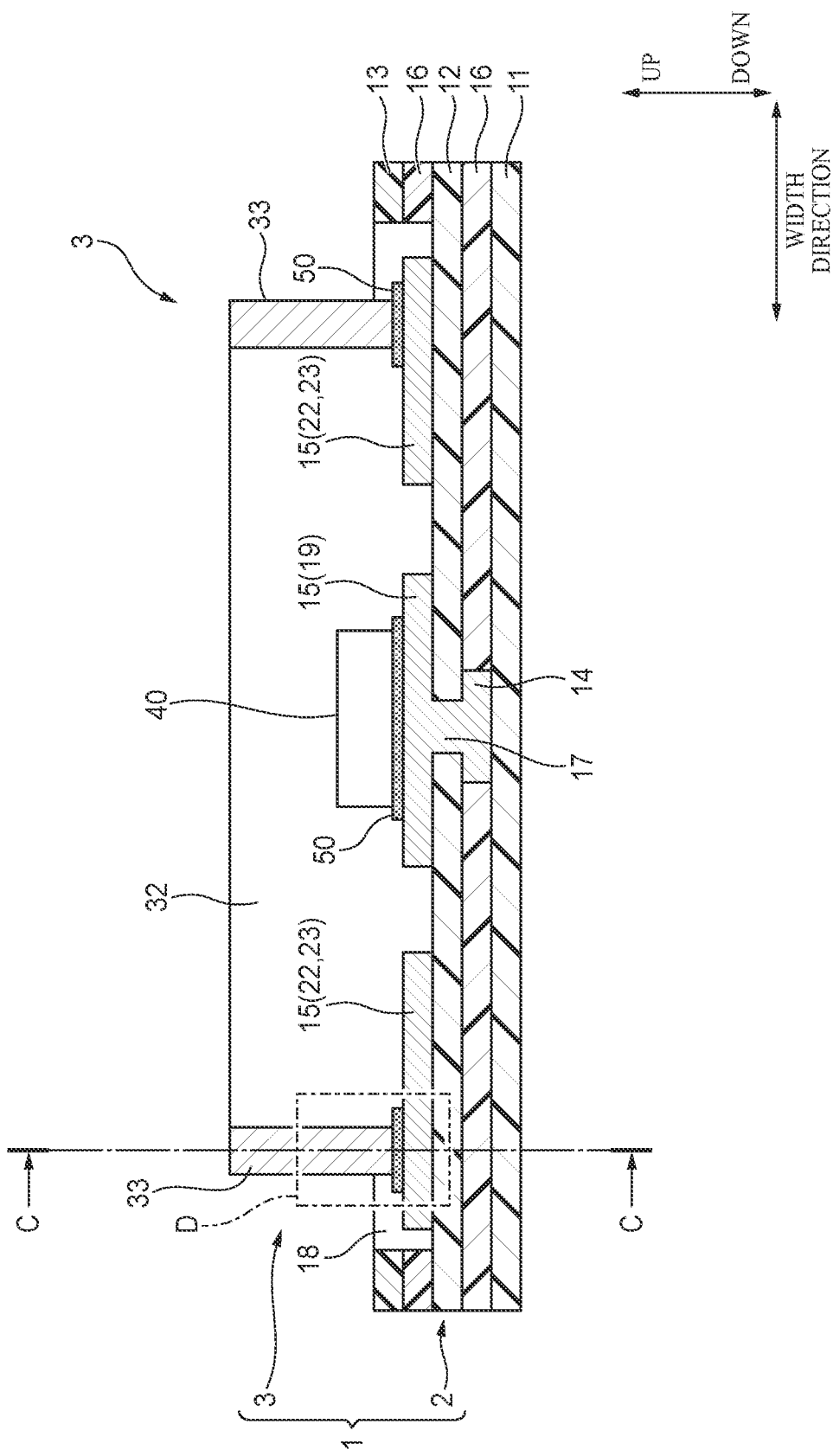
FIG. 4 is an A-A sectional view of FIG. 2.

First, the circuit body 2 will be described. The circuit body 2 is an FPC that extends like a band. More specifically, as shown in FIG. 4, the circuit body 2 has three thin-film insulating layers consisting of a first insulating layer 11, a second insulating layer 12 located over the first insulating layer 11, and a third insulating layer 13 located over the second insulating layer 12. A thin-film lower conductive layer 14 is sandwiched between the first insulating layer 11 and the second insulating layer 12 and a thin-film upper conductive layer 15 is sandwiched between the second insulating layer 12 and the third insulating layer 13. In this example, the lower conductive layer 14 and the upper conductive layer 15 constitute a "wiring pattern" which is a term used in the present disclosure. Typically, the first to third insulating layers 11-13 are made of polyimide and the lower conductive layer 14 and the upper conductive layer 15 are made of copper. The first to third insulating layers 11-13 may be made of PET (polyethylene terephthalate) or PEN (polyethylene naphthalate) instead of polyimide.

A resin adhesive layer 16 is sandwiched between the first insulating layer 11 and the second insulating layer 12 in a region where the lower conductive layer 14 is not formed, and another resin adhesive layer 16 is sandwiched between the second insulating layer 12 and the third insulating layer 13 in a region where the upper conductive layer 15 is not formed. Whereas the lower conductive layer 14 and the upper conductive layer 15 are mostly insulated from each other by the second insulating layer 12 located between them, they are electrically connected to each other by plural conductive connection portions 17 (also see FIG. 1) that penetrate through the second insulating layer 12 in the top-bottom direction at plural positions. In this manner, the circuit body 2 has a lamination structure in which the two conductive layers 14 and 15 are buried between the three insulating layers 11-13.

Figure 2:
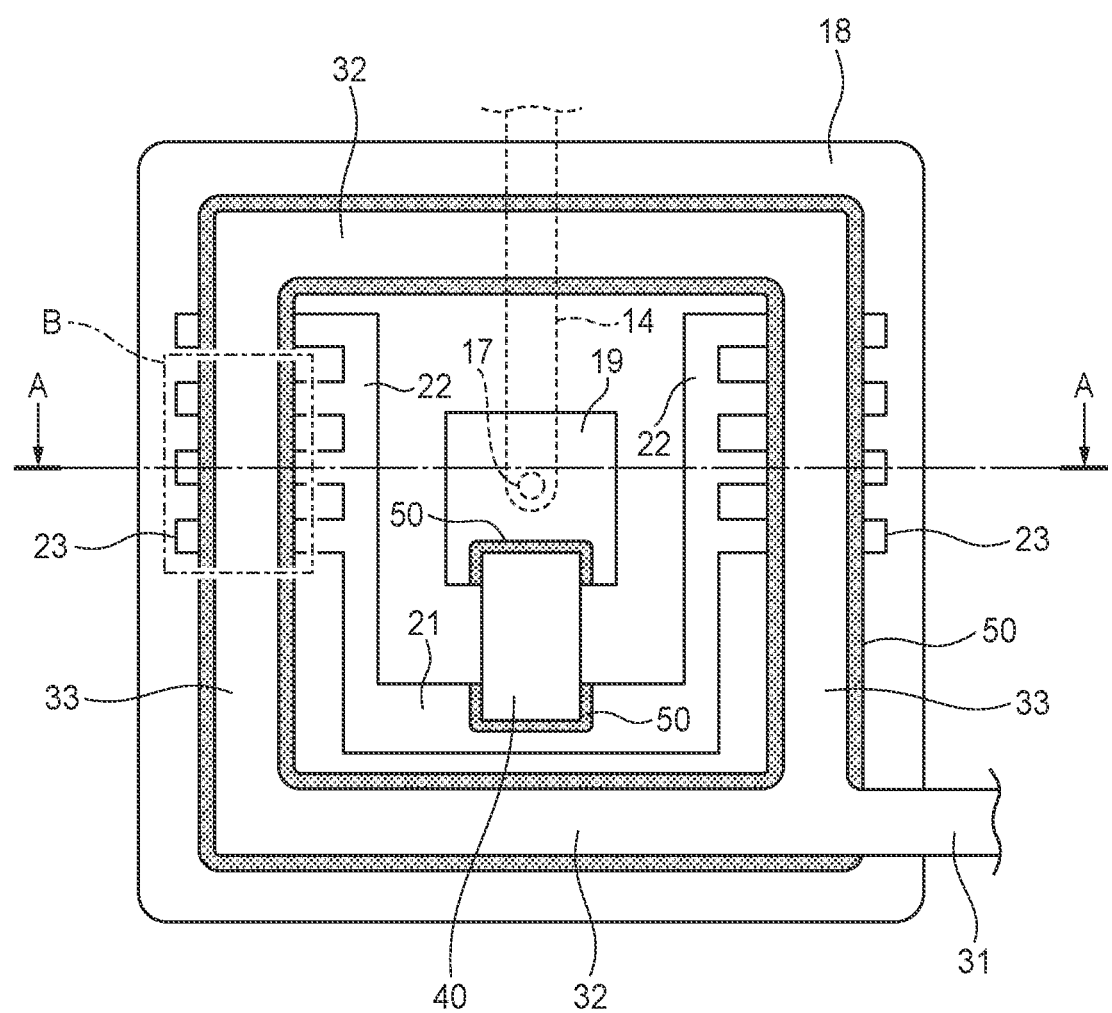
FIG. 2 is a plan view of part of the connection structure shown in FIG. 1.

As shown in FIGS. 1 and 2, an opening region 18 is formed in the top surface of a front end portion of the circuit body 2 so as to be shaped like a rectangular recess and to have, as its bottom surface, the top surface of a portion, exposed by removal of a portion of the third insulating layer 13 and a portion, adjoining the removed portion of the third insulating layer 13 from below, of the adhesive layer 16. A rectangular first conductive portion 19 is formed inside the opening region 18 (on the top surface of the second insulating layer 12) at the center of the opening region 18 as a portion of the upper conductive layer 15.

Furthermore, a band-shaped (rectangular) second conductive portion 21 that extends to both sides in the width direction from a position that is spaced forward from the first conductive portion 19 by a prescribed distance and a pair of band-shaped (rectangular) third conductive portions 22 that extend rearward from the two ends, in the width direction, of the second conductive portion 21, respectively, are formed inside the opening region 18 as portions of the upper conductive layer 15. The pair of third conductive portions 22 are spaced from the first conductive portion 19 in the width direction by a prescribed distance. That is, a U-shaped conductive portion that is composed of the second conductive portion 21 and the pair of third conductive portions 22 is formed so as to be spaced from the first conductive portion 19 by prescribed distances and to surround it from three directions. As described later, the first conductive portion 19 and the second conductive portion 21 are electrically connected to each other by a chip fuse 40.

Still further, plural connection target portions 23 are formed inside the opening region 18 as portions of the upper conductive layer 15 so as to project outward in the width direction from rear portions of the pair of third conductive portions 22 and to be spaced from each other in the front-rear direction. Each of the connection target portions 23 is shaped like a band (rectangle) that is uniform in width (i.e., the dimension in the front-rear direction). In this example, the interval A1 (see FIG. 3) between connection target portions 23 that are adjacent to each other in the front-rear direction is 20 μm. As described later, connection portions 33 of the conductive body 3 are electrically connected to the plural connection target portions 23 by a conductive adhesive 50. The description of the circuit body 2 completes here.

Next, the conductive body 3 will be described. As shown in FIGS. 1 and 2, in this example, the conductive body 3 is a busbar that is rectangular in cross section and is composed of a main body portion 31 that extends straightly in the width direction and a rectangular-frame-shaped frame portion 32 that is continuous with one end of the main body portion 31. It can also be said that the frame portion 32 is shaped like a rectangular cylinder that extends in the top-bottom direction.

Among the four sides of the frame portion 32, the two sides (two portions) that are opposed to each other in the width direction and extend in the front-rear direction are particularly referred to as "connection portions 33." When viewed from above, each connection portion 33 is shaped like a band (rectangle) that is uniform in width (i.e., the dimension in the width direction). It can also be said that each connection portion 33 is shaped like a flat plate that extends in the front-rear direction and the top-bottom direction. The width A2 (the dimension in the width direction, see FIG. 3) of each connection portion 33 is shorter than the extension length of the connection target portions 23 in the width direction. The conductive body 3 is typically made of aluminum. The description of the conductive body 3 completes here.

Figure 5:
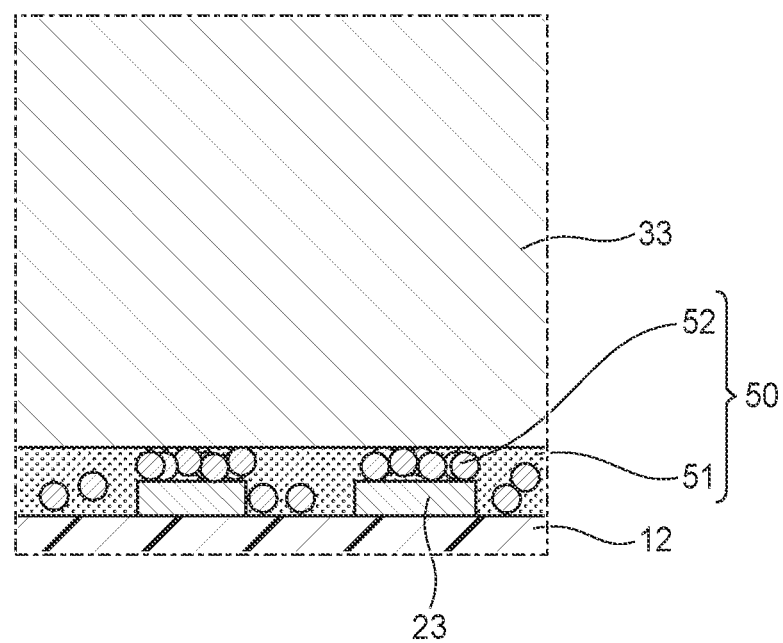
FIG. 5 is an enlarged C-C sectional view of part D of FIG. 4.
Figure 5:
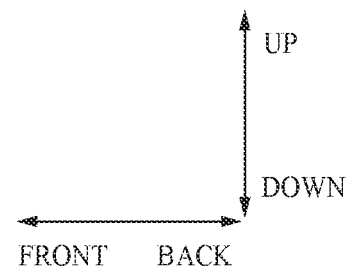

Next, a description will be made of how the circuit body 2 and the conductive body 3 are attached to each other to obtain the connection structure 1 shown in FIGS. 1 and 2. First, conductive adhesive 50 in a flowable state is applied to the bottom surface (rectangular-frame-shaped surface) of the frame portion 32 of the conductive body 3. As shown in FIG. 5, the adhesive 50 has a composition that a large number of conductive fillers (e.g., metal particles) 52 are dispersed in a base material 51 which is a thermosetting resin.

Figure 3:
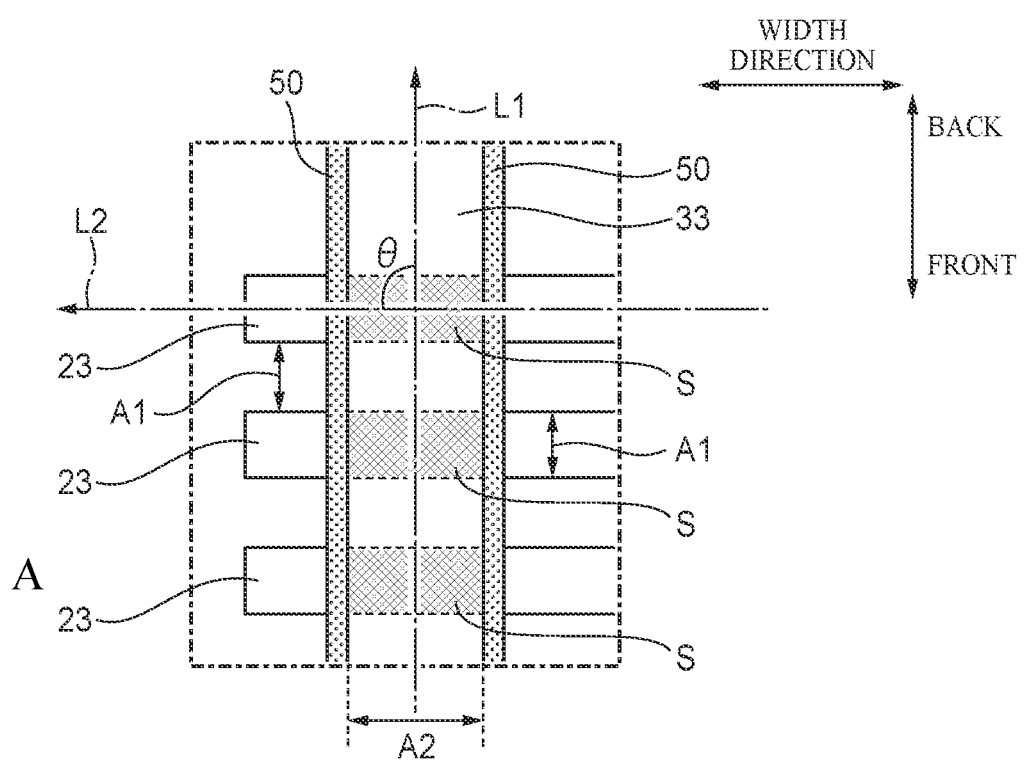
FIG. 3 is an enlarged view of part B of FIG. 2.

Subsequently, the frame portion 32 of the conductive body 3 is pushed downward toward the bottom surface of the opening region 18 of the circuit body 2 using, for example, a presser (not shown) so that each connection portion 33 is put on the top surfaces of the plural corresponding connection target portions 23 excluding their end portions located on both sides in the width direction. In this example, at this time, as shown in FIG. 3, the angle θ formed by the axial line L1 of each connection portion 33 and the axial line L2 of each corresponding connection target portion 23 is equal to 90 degrees. In each of regions S shown in FIG. 3, each connection portion 33 and each corresponding connection target portion 23 overlap with each other when viewed from above. As described later, in each region S, the connection portion 33 and the connection target portion 23 are electrically connected to each other by fillers 52 existing in the adhesive 50. Thus, the size of each region S influences the magnitude of the contact resistance between the connection portion 33 and the connection target portion 23. From this point of view, for the sake of convenience, the size of each region S will be referred to as a "contact area" of each connection portion 33 and a corresponding connection target portion 23. This also applies to each region S shown in FIG. 6B.

As a result, as shown in FIG. 5, a remaining part of the base material 51 and remaining fillers 52 of the adhesive 50 are pushed out from between the connection portions 33 and the connection target portions 23 while fillers 52 of the adhesive 50 are left between the connection portions 33 and the connection target portions 23. Subsequently, while the state that the conductive body 3 is pushed by, for example, the presser, is maintained the adhesive 50 is heated via the conductive body 3 by increasing the temperature of a heater that is incorporated in the presser, whereby the base material 51 which is a thermosetting resin is set. As a result, the connection portions 33 are bonded to the plural connection target portions 23 and electrically connected to the latter by the fillers 52. On the same principle, the portions, other than the portions connected to the plural connection target portions 23, of the frame portion 32 of the conductive body 3 are also bonded to the bottom surface of the opening region 18 (i.e., the top surface of the second insulating layer 12) by the adhesive 50. The attachment of the conductive body 3 to the circuit body 2 is thus completed.

Subsequently, the chip fuse 40 is set so as to bridge the first conductive portion 19 and the second conductive portion 21 and is bonded and fixed to each of the first conductive portion 19 and the second conductive portion 21 using the same adhesive 50 as described above. Alternatively, the chip fuse 40 may be bonded and fixed by using solder. As a result, one of electrodes formed at two respective end portions of the chip fuse 40 is bonded to the first conductive portion 19 and electrically connected to the latter by fillers 52 and the electrode formed at the other end portion of the chip fuse 40 is bonded to the second conductive portion 21 and electrically connected to the latter by fillers 52. Thus, the connection structure 1 shown in FIGS. 1 and 2 is completed. In the connection structure 1, the first conductive portion 19 which is part of the upper conductive layer 15 of the circuit body 2 is electrically connected to the main body portion 31 of the conductive body 3 via the chip fuse 40, the second conductive portion 21, the third conductive portions 22, the connection target portions 23, and the connection portions 33.

As described above, in the connection structure 1 according to the embodiment, the wiring pattern of the circuit body 2 has the two sets of connection target portions 23 that extend in such a direction as to cross the two respective connection portions 33 of the conductive body 3. Thus, when each connection portion 33 is connected to the corresponding set of connection target portions 23 using a conductive adhesive 50, even in the event of a positional deviation between each connection portion 33 and the corresponding set of connection target portions 23, the variation of their contact area is smaller than in a case that each connection portion 33 is parallel with a connection target portion 23. For example, where the connection portions 33 and the connection target portions 23 are arranged in the manner shown in FIG. 3, the overlap area (contact area) of each connection portion 33 and each corresponding connection target portion 23 is kept substantially the same even if a positional deviation occurs in the width direction of the connection portion 33 (in the direction L2 shown in FIG. 3). As seen from the above description, also when a positional deviation occurs in a direction that is different from the width direction (e.g., in an oblique direction between the directions L1 and L2 shown in FIG. 3), the contact area of each connection portion 33 and each corresponding connection target portion 23 is kept substantially the same as in the above-described case. As such, in the connection structure 1 according to the embodiment, the circuit body 2 using a flexible printed circuit can be connected properly to the conductive body 3 having the flat-plate-shaped connection portions 33.

In the connection structure 1, each connection portion 33 of the conductive body 3 has a rectangular shape that is uniform in width (the dimension in the width direction) and each connection target portion 23 of the wiring pattern has a rectangular shape that is uniform in width (the dimension in the front-rear direction) (see FIG. 3, for example). Thus, when a positional deviation occurs between them, the variation of their contact area can be made smaller than in a case that each connection portion 33 and each connection target portion 23 do not have the above shapes.

In the connection structure 1, the conductive body 3 and the wiring pattern are connected to each other at plural portions via the plural connection portions 33. Thus, the posture of the conductive body 3 with respect to the wiring pattern is less prone to be disordered (e.g., the inclination of the conductive body 3 with respect to the wiring pattern is less prone to occur) as compared with the case where only one connection portion is present for connecting the conductive body 3 to the wiring pattern. As a result, a connection failure etc. due to inclination of the conductive body 3 are less prone to occur between the conductive body 3 and the wiring pattern.

In the connection structure 1, the angle θ at which each connection target portion 23 of the wiring pattern crosses the corresponding connection portion 33 of the conductive body 3 (i.e., the angle θ formed by the axial line L1 of each connection 33 and the axial line L2 of each of the corresponding connection target portions 23; see FIG. 3) is equal to 90 degrees. As a result, the variation of the contact area of each connection 33 and each of the corresponding connection target portions 23 can be made small when a positional deviation occurs between them while their contact area is kept proper.

In the connection structure 1, the connection portions 33 of the conductive body 3 are disposed so as to be located inside the opening region 18 that is formed in the circuit body 2. Thus, the connection portions 33 do not go up onto the insulating layer (more specifically, third insulating layer 13) of the circuit body 2 at the periphery or the like of the opening region 18 and hence inclination of the conductive body 3 with respect to the wiring pattern is less prone to occur. As a result, a connection failure etc. are less prone to occur between the conductive body 3 and the wiring pattern due to inclination of the conductive body 3.

Furthermore, in the connection structure 1, the plural connection target portions 23 of each set of the wiring pattern are spaced from each other by 20 μm. As a result, at the time of joining using an adhesive 50, part of the base material 51 of the adhesive 50 and excess fillers 52 can properly be pushed out and escape to the gaps between the connection target portions 23 whereas the contact area of each connection portion 33 and each corresponding connection target portion 23 is made as large as possible. This facilitates the joining of the connection portions 33 and the connection target portions 23.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

Figure 6A:
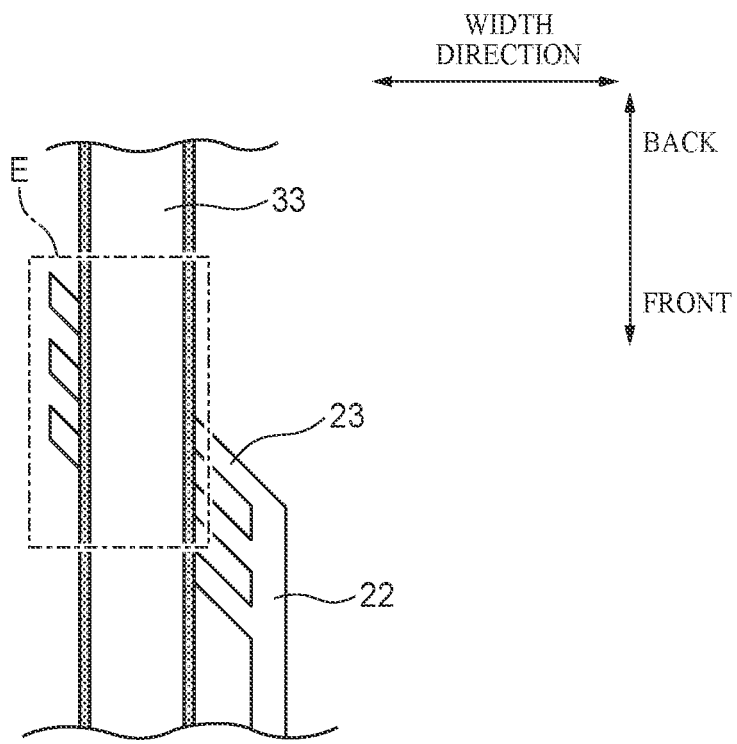
FIG. 6A is a view, corresponding to FIG. 3, of another exemplary embodiment.
Figure 6B:
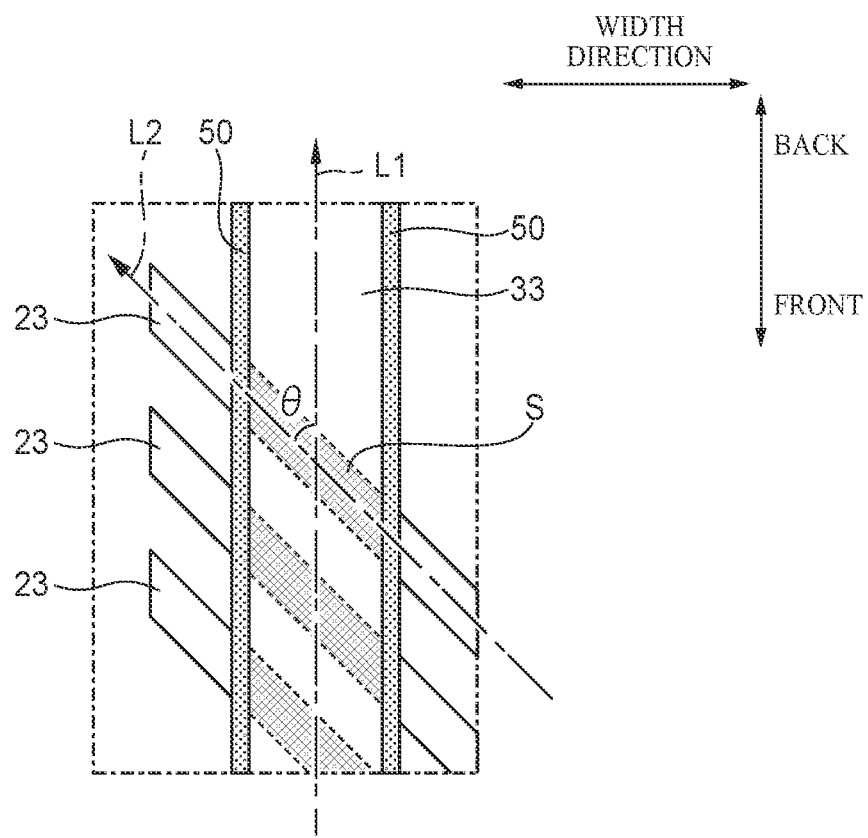
FIG. 6B is an enlarged view of part E of FIG. 6A.

In the above-described embodiment, the angle θ formed by the axial line L1 of each connection portion 33 and the axial line L2 of each corresponding connection target portion 23 is equal to 90 degrees (see FIG. 3). Alternatively, as shown in FIG. 6B, the angle θ may be different from 90 degrees as long as the axial line L1 of each connection portion 33 and the axial line L2 of each corresponding connection target portion 23 are not parallel with each other (i.e., the angle θ is larger than 0 degrees). In this case, the contact area of each connection portion 33 and each corresponding connection target portion 23 can be made larger than in the case that the angle θ is equal to 90 degrees.

Figure 7:
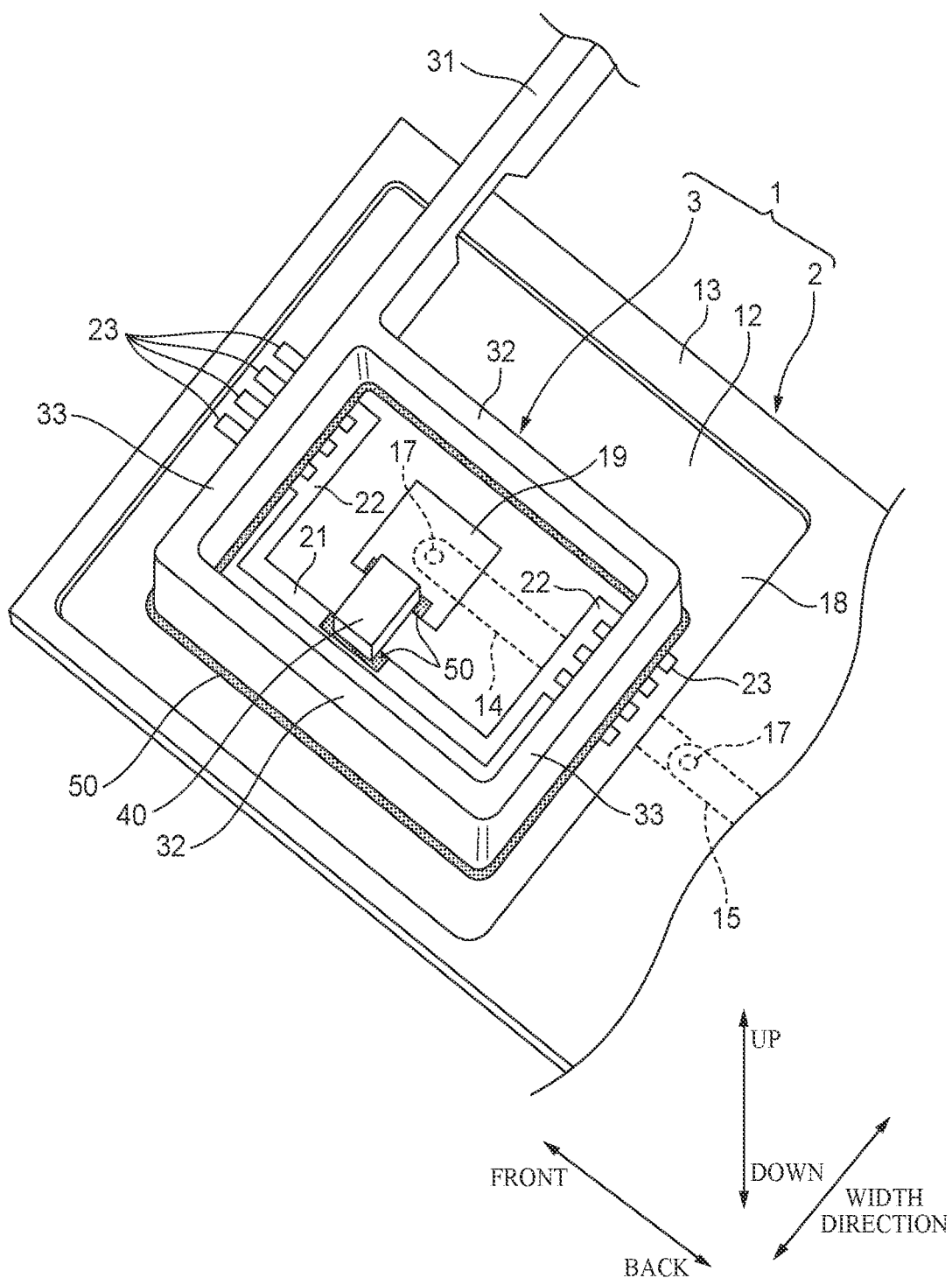
FIG. 7 is a perspective view, corresponding to FIG. 1, of a still another exemplary embodiment.

Furthermore, in the above embodiment, the plural connection target portions 23 of the circuit body 2 extend in the same direction as the width direction (i.e., the direction that is perpendicular to the extension direction of the circuit body 2 (see FIG. 1). Alternatively, as shown in FIG. 7, the plural connection target portions 23 of the circuit body 2 may extend in the same direction as the front-rear direction (i.e., the extension direction of the circuit body 2). In this case, the angle θ formed by the axial line L of each connection portion 33 and the axial line L2 of each corresponding connection target portion 23 can also be made equal to 90 degrees by using portions, opposed to each other in the front-rear direction and extending in the width direction, of the frame portion 32 of the conductive body 3 as connection portions 33 as shown in FIG. 7.

Still further, in the above embodiment, the portions of the rectangular-frame-shaped frame portion 32 of the conductive body 3 are used as the connection portions 33 of the conductive body 3. Alternatively, a portion or portions of a conductive body 3 having a shape (e.g., U shape, L shape, or I shape) other than a rectangular frame shape may be used as a connection portion or portions 33 of the conductive body 3.

According to the above exemplary embodiment, the connection structure (1) comprises: a circuit body (2) including a flexible printed circuit having a wiring pattern; and a conductive body (3) including a connection portion (33). The connection portion (33) has a flat-plate shape and is connected to a mounting surface of the circuit body (2).

The wiring pattern has a plurality of connection target portions (23) each extending in a preset direction to cross the connection portion (33) and is longer than a width of the connection portion (33) in the preset direction.

The connection portion (33) and the connection target portions (23) are electrically connected using a conductive adhesive (50) to connect the wiring pattern and the conductive body (3).

In the connection structure having this configuration, the wiring pattern of the circuit body has the connection target portions that extend in such a direction as to cross the connection portion of the conductive body. Thus, when the connection portion is connected to the connection target portions using a conductive adhesive, even when the relative positional relationship between the connection portion and the connection target portions is different from a designed one (i.e., even in the event of a positional deviation), the variation of the contact area of the connection portion and each connection target portion is smaller than in a case that the connection portion is parallel with a connection target portion.

More specifically, if the connection portion were parallel with a connection target portion, their contact area might increase or decrease in the event of a positional deviation depending on their widths and lengths and a direction of the positional deviation. For example, in a case that the connection portion and a connection target portion are parallel with each other and approximately the same in width and length, the contact area is equal to the product of their width and length as long as they completely coextend with each other. However, for example, if a positional deviation occurs in the width direction, the contact area decreases as their overlap area decreases. In contrast, where as in the connection structure having this configuration the connection portion crosses each connection target portion and each connection target portion is longer than the width of the connection portion (see FIG. 3 etc.), their overlap area (contact area) is kept substantially the same even in the event of a positional deviation in the width direction. The same is true of a case of a positional deviation in a direction (e.g., oblique direction) that is different from the width direction. As such, in the connection structure having this configuration, the circuit body including a flexible printed circuit can be connected properly to the conductive body having the flat-plate-shaped connection portion.

The above connection structure (1) may be configured in such a manner that: the connection portion (33) has a rectangular shape having a first uniform width, and the plurality of the connection target portions (23) each has a rectangular shape having a second uniform width.

In the connection structure having this configuration, the connection portion of the conductive body has a rectangular shape that is uniform in width and each of the plural connection target portions of the wiring pattern has a rectangular shape that is uniform in width. Thus, when a positional deviation occurs between the connection portion and each connection target portion, the variation of their contact area is smaller than in a case that the connection portion and each connection target portion do not have the above shapes (e.g., in a case that they have such nonuniform shapes that their widths vary depending on the position).

The connection portion and each connection target portion being "uniform" in width means that their widths are uniform in ranges of allowances (what is called "variations in manufacture") that are unavoidable in formation of the conductive body and the wiring pattern. In other words, this expression means that the widths of the connection portion and each connection target portion are uniform in design (e.g., numerical values of these widths on a design drawing are uniform).

In the above connection structure (1), the conductive body (3) may have a plurality of connection portions (33).

In the connection structure having this configuration, the conductive body and the wiring pattern are connected to each other at plural positions via the plural connection portions. In other words, the conductive body is supported by the wiring pattern at plural positions. Thus, the posture of the conductive body with respect to the wiring pattern is less prone to be disordered (e.g., the variation of the inclination of each connection portion of the conductive body with respect to the mounting surface of the flexible printed circuit is made small). As a result, a connection failure etc. due to such disorder of the posture of the conductive body are less prone to occur.

The above connection structure (1) may be configured in such a manner that: the circuit body (2) has an insulating layer (11, 12, 13) covering the wiring pattern and an opening region (18) formed in the insulating layer to expose the connection target portions (23); and that the connection portion (33) is located inside the opening region (18).

In the connection structure having this configuration, the connection portion of the conductive body is disposed so as to be located inside the opening that is formed in the insulating layer of the circuit body. Thus, the connection portion does not go up onto the periphery of the opening (i.e., the step between the region where the insulating layer exists and the region where it does not) and hence the posture of the conductive body with respect to the wiring pattern is less prone to be disordered. As a result, a connection failure etc. are less prone to occur between the conductive body and the wiring pattern.

As such, the invention can provide a connection structure capable of properly connecting a circuit body including a flexible printed circuit and a conductive body having a flat-plate-shaped connection portion.

What is claimed is:

1. A connection structure comprising:
   a circuit body including a flexible printed circuit having a wiring pattern; and
   a conductive body including a connection portion, the connection portion having a flat-plate shape and being connected to a mounting surface of the circuit body,
   the wiring pattern having a plurality of connection target portions each extending in a preset direction to cross the connection portion and being longer than a width of the connection portion in the preset direction,
   the connection portion being electrically connected to each of the connection target portions using a conductive adhesive to connect the wiring pattern and the conductive body,
   the connection target portions are spaced away from each other in a second direction that intersects the preset direction, and
   the connection portion crosses each of the connection target portions in the second direction.

2. The connection structure according to claim 1, wherein
   the connection portion has a rectangular shape having a first uniform width, and
   the plurality of the connection target portions each have a rectangular shape having a second uniform width.

3. The connection structure according to claim 1, wherein
   the conductive body has a plurality of the connection portions.

4. The connection structure according to claim 1, wherein
   the circuit body has an insulating layer covering the wiring pattern and an opening region formed in the insulating layer to expose the connection target portions, and
   the connection portion is located inside the opening region.

* * * * *